United States Patent [19]

Ota et al.

[11] Patent Number: 5,201,986
[45] Date of Patent: Apr. 13, 1993

[54] DIAMOND SYNTHESIZING METHOD

[75] Inventors: Nobuhiro Ota; Naoji Fujimori, both of Hyogo; Takayuki Shibata, Hokkaido, all of Japan

[73] Assignee: Sumitomo Electric Industries, Ltd., Osaka, Japan

[21] Appl. No.: 739,995

[22] Filed: Aug. 2, 1991

[30] Foreign Application Priority Data

Aug. 7, 1990 [JP] Japan .................... 2-210021
Aug. 10, 1990 [JP] Japan .................... 2-213097

[51] Int. Cl.$^5$ ............................ C30B 25/14
[52] U.S. Cl. ................... 156/610; 156/DIG. 68; 423/446; 427/580; 427/577
[58] Field of Search ........... 423/446; 156/610; 521/86; 204/174.13; 427/39

[56] References Cited

U.S. PATENT DOCUMENTS

| | | | |
|---|---|---|---|
| 3,317,354 | 5/1967 | Darrow et al. | 423/446 |
| 3,961,103 | 6/1976 | Aisenberg | 423/446 |
| 4,816,286 | 3/1989 | Hirose | 423/446 |
| 4,830,702 | 5/1989 | Singh et al. | 423/446 |
| 4,915,977 | 4/1990 | Okamoto et al. | 423/446 |

FOREIGN PATENT DOCUMENTS

| | | | |
|---|---|---|---|
| 60-122794 | 7/1985 | Japan | 423/446 |
| 64-42393 | 2/1989 | Japan | 423/446 |
| 2219578 | 12/1989 | United Kingdom | 423/446 |

Primary Examiner—Robert Kunemund
Attorney, Agent, or Firm—W. G. Fasse

[57] ABSTRACT

A diamond synthesizing method introduces a mixed gas of hydrocarbon gas and hydrogen gas into a reaction vessel (9) which is maintained under a pressure of 1 to 100 Torr. A dc discharge is caused across a cathode (1) and an anode (2), thereby depositing diamond on a substrate (3) which is placed on the anode (2). A positive column of $H\alpha > CH$ is produced with a high formation rate of atomic hydrogen for promoting decomposition of the hydrocarbon gas, and the concentration of hydrocarbon is reduced while maintaining the condition. According to this method, it is possible to synthesize high-quality diamond, which hardly any non-diamond carbon components such as amorphous carbon and graphite, at a film forming rate of about 1 μm/h.

2 Claims, 1 Drawing Sheet

5,201,986

DIAMOND SYNTHESIZING METHOD

FIELD OF THE INVENTION

The present invention relates to a vapor-phase synthesizing method for diamond, and more particularly, it relates to a diamond synthesizing method comprising the steps of introducing a mixed gas of hydrocarbon gas and hydrogen gas into a reaction vessel which is held under a low-pressure atmosphere and causing a dc discharge across a cathode and an anode, thereby depositing diamond on a substrate which is placed on the anode.

BACKGROUND INFORMATION

Diamond has the following properties:
a. high hardness;
b. excellent wear resistance;
c. small compressibility as well as a small coefficient of thermal expansion;
d. extremely high heat conductivity for its function as an insulator;
e. optical transparency against ultraviolet, visible and infrared rays with a high refractive index;
f. excellent chemical resistance;
g. excellent acoustic wave propagation velocity; and
h. capability of providing semiconductor properties upon doping with a specific impurity.

In consideration of such various properties, attempts have been made to use diamond in various fields. Diamond is now regarded as a necessary and indispensable substance in industry.

As is well known in the art, diamond has been synthesized from a vapor phase by a CVD process such as a microwave CVD process, a thermal filament CVD process or the like. Thus, it has been made possible to synthesize diamond in the form of a film, or to coat the surface of another material with diamond, in order to effectuate the excellent properties of diamond. Following development of such techniques, the range of application of diamond is now increasing.

Among various vapor-phase synthesizing methods, a diamond synthesizing method using dc discharge has already been developed. In a synthesizing method using discharge under a relatively high pressure region of at least 100 Torr, it is possible to synthesize diamond at a high speed. On the other hand, a synthesizing method using dc discharge under a low pressure of 1 to 100 Torr is suitable for forming a diamond film at a low temperature over a wide area, as well as forming a diamond film on a substrate having a three-dimensional configuration.

Although the diamond synthesizing method using a dc discharge under a low pressure has the aforementioned advantages, the growth rate of diamond is slower and the as-formed diamond is inferior in quality compared with the microwave CVD process and the thermal filament CVD process.

SUMMARY OF THE INVENTION

It is an object of the present invention to provide a diamond synthesizing method using a dc discharge under a low pressure, which can obtain diamond substantially at the same growth rate and with the same quality as the microwave CVD process and the thermal filament CVD process.

In relation to a diamond synthesizing process using a dc discharge under a low pressure, the inventors have found that it is possible to produce a positive column of $H\alpha > CH$ in the emission spectrum by increasing the concentration of hydrocarbon gas with respect to hydrogen gas. The present invention is based on such recognition.

The diamond synthesizing method according to the present invention comprises the steps of introducing a mixed gas of hydrocarbon gas and hydrogen gas into a reaction vessel which is held under a pressure of 1 to 100 Torr and causing a dc discharge across a cathode and an anode, thereby depositing diamond on a substrate which is placed on the anode.

According to one aspect of the present invention, the concentration of the hydrocarbon gas with respect to the hydrogen gas is increased until emission intensities of $H\alpha(656.3 \text{ nm})$ and $CH (431.4 \text{ nm})$ satisfies a condition of $H\alpha > CH$ in the emission spectrum of a positive column which is produced during the discharge, and the concentration of the hydrocarbon gas is reduced after the positive column satisfying the aforementioned condition is produced or established.

According to another aspect of the present invention, the concentration of the hydrocarbon gas with respect to the hydrogen gas is increased until emission intensities of $H\alpha$ (656.3 nm) and $CH$ (431.4 nm) satisfies emission condition of $H\alpha > CH$ in the emission spectrum of a positive column which is produced during the discharge, and a gas containing oxygen elements is added to the mixed gas under the aforementioned emission condition.

The inventors have caused dc discharge across a cathode and an anode and measured the emission spectrum in a region restricted to the positive column, to note the emission intensities of $H\alpha$ and $CH$. When the concentration of hydrocarbon gas with respect to hydrogen gas is increased, the relation between the emission intensities is discontinuously changed from $H\alpha < CH$ to $H\alpha > CH$ in the positive column. Comparing plasma states of these cases from the results of spectroscopic analysis, the spectral intensity of $H\alpha$ is increased in the latter case by about 100 times as compared with the former case. Thus, it is conceivable that atomic hydrogen is abruptly increased in the positive column. Further, the emission intensity of CH is also increased, and it is recognized that decomposition of the hydrocarbon gas is simultaneously promoted. Namely, when diamond is synthesized under the aforementioned emission condition, it is possible to improve the diamond film quality by increasing atomic hydrogen, which is regarded as having an important function of removing non-diamond components, while the diamond growth rate can be increased since decomposition of the hydrocarbon gas is promoted. In a diamond vapor-phase synthesizing method such as a microwave CVD process, a thermal filament CVD process or the like, however, increase of hydrocarbon concentration causes deterioration of the diamond film quality. Such a phenomenon also takes place in a diamond synthesizing method using a dc discharge under a low pressure. If diamond is synthesized under such a condition of hydrocarbon concentration for producing a positive column of $H\alpha > CH$, therefore, the quality of the as-formed diamond is insufficient.

In order to improve the diamond film quality, therefore, it is necessary to reduce the hydrocarbon concentration. The inventors have cleared up the following fact by spectroscopic analysis: Once a positive column of $H\alpha > CH$ is produced by increase of the concentration of the hydrocarbon gas, it is possible to stably maintain the positive column of Hα>CH even if the concentration of the hydrocarbon gas is thereafter reduced to such a degree that the relation between the emission intensities in the positive column goes to Hα<CH in general. In other words, it is possible to implement synthesis of high-quality diamond by reducing the hydrocarbon concentration while maintaining such a state that production of atomic hydrogen is promoted in the positive column.

In another aspect of the present invention, oxygen, which can more effectively remove non-diamond components than hydrogen, is added under the condition of hydrocarbon concentration for stably maintaining the positive column of Hα>CH, to enable synthesis of high-quality diamond. In this case, the oxygen source may be an oxygen containing compound such as carbon monoxide or carbon dioxide, in addition to the simple substance of oxygen. A similar effect can be attained also in this case.

According to the first aspect of the present invention, as hereinabove described, the positive column of Hα>CH is produced with a high formation rate of atomic hydrogen for promoting decomposition of hydrocarbon gas, and the hydrocarbon concentration is reduced while maintaining this condition. According to this method, it is possible to synthesize high-quality diamond which hardly contains non-diamond carbon components such as amorphous carbon and graphite, at a film forming rate of about 1 $\mu m/h$.

According to the second aspect of the present invention, on the other hand, the positive column of Hα>CH is generated with a high formation rate of atomic hydrogen for promoting decomposition of hydrocarbon gas, and oxygen which can effectively remove non-diamond carbon components is added to the mixed gas under this condition. Thus, it is possible to synthesize high-quality diamond which hardly contains any non-diamond carbon components such as amorphous carbon and graphite, at a film forming rate of about 1 $\mu m/h$.

Further, it is possible to synthesize high-quality diamond under the above described condition even if a substrate is maintained at a low temperature of 300–400° C. Therefore, a variety of materials such as glass may be used as a substrate.

The foregoing and other objects, features, aspects and advantages of the present invention will become more apparent from the following detailed description of the present invention when taken in conjunction with the accompanying drawing.

DESCRIPTION OF THE PREFERRED EMBODIMENTS

EXAMPLE 1

Figure 1:
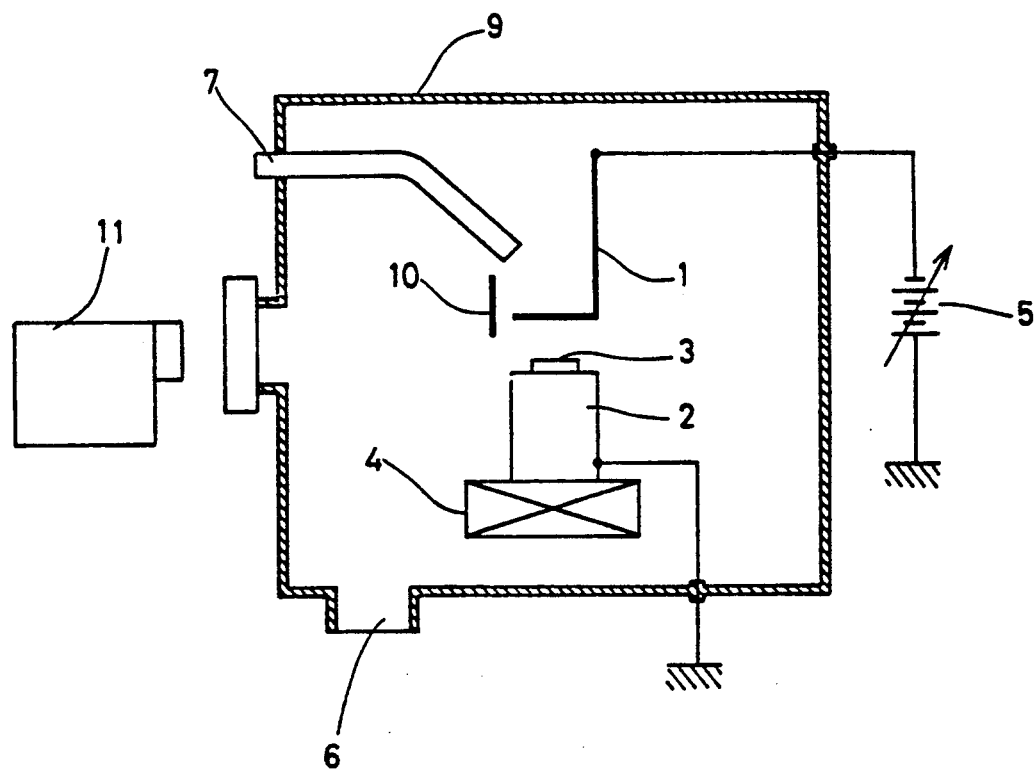
FIG. 1 illustrates an exemplary diamond synthesizing apparatus.

A mixed gas of hydrogen and methane was employed as a reactive gas, to cause a dc discharge across a cathode 1 and an anode 2. The methane concentration with respect to hydrogen and the discharge current were changed to make a plasma spectroscopic analysis in a region restricted to the positive column. FIG. 1 schematically illustrates an apparatus employed for this Example. This apparatus comprises the cathode 1, the anode 2, a substrate 3 carried by the anode 2, a heater 4, a dc power source 5, an exhaust system 6, a raw material gas supply system 7, a vacuum vessel 9, a shielding plate 10, and a spectroscope 11.

The cathode 1 was formed by an L-shaped Mo mesh member, and connected with the dc power source 5. The anode 2 was formed by a cylindrical W member. The bottom size of the L-shaped cathode 1 was 30 mm by 30 mm, with a mesh diameter of 0.2 mm and a pitch of 1 mm. On the other hand, the cylindrical cathode 2 was 30 mm in diameter and 10 mm in height. The cathode-to-anode distance was 10 mm, and the gas pressure was fixed at 40 Torr. The shielding plate 10 was adapted to prevent influencing the emission in the vicinity of the cathode mesh during plasma spectrometry, and the spectroscope 11 was set to focus on a position upwardly separated from the cathode 2 by about 2 to 5 mm. The emission spectra of the positive column measured under the aforementioned conditions, show emission peaks of Hα (656.3 nm) and CH (431.4 nm). The emission intensities were compared with each other. Table 1 shows the results.

TABLE 1

| Methane | Discharge Current (A) | | |
|---|---|---|---|
| Concentration (%) | 0.5 | 1.0 | 1.5 |
| 0.2 | X | X | X |
| 0.3 | X | X | X |
| 0.4 | X | X | O |
| 0.5 | X | X | O |
| 0.6 | X | O | O |
| 0.8 | X | O | O |
| 1.0 | O | O | O |
| 1.5 | O | O | O |
| 2.0 | O | O | O |

Referring to Table 1, the emission spectra are evaluated as follows:

O: The emission intensity of Hα is stronger than that of CH.

x: The emission intensity of Hα is weaker than that of CH.

As clearly understood from the results shown in Table 1, the emission intensity of CH was stronger than that of Hα in the plasma state of the positive column when the methane concentration was low. When the methane concentration was increased, on the other hand, the relation between the emission intensities was inverted to discontinuously produce a positive column of Hα>CH. Further, the emission intensities of Hα and CH themselves were abruptly increased by about 100 times in H∇ and by several times in CH. It is understood from Table 1 that the positive column of Hα>CH was easily produced also when the discharge current was high.

The methane concentration was increased until a positive column of Hα>CH was produced, and thereafter the methane concentration was reduced, to recognize that the plasma state of the positive column was maintained in the relation of Hα>CH even if the methane concentration was reduced to 0.1%.

The aforementioned tendency was similarly attained also when acetylene, benzene and ethanol were used as carbon sources in place of methane.

EXAMPLE 2

The apparatus shown in FIG. 1 was used to synthesize diamond. The cathode 1 was formed by an Mo mesh member having a mesh diameter of 0.2 mm and a pitch of 1 mm. The size of the L-shaped bottom of the cathode 1 was 30 mm by 30 mm. The anode 2 was formed by a cylindrical W member of 30 mm in diameter and 10 mm in height. The cathode-to-anode distance was 10 mm. The substrate 3 was formed by a monocrystal Si member of 20 mm by 20 mm. The substrate 3 was placed on the anode 2 and heated by the heater 4, so that its temperature was maintained at 700° C. The reactive gas was prepared from a mixed gas of hydrogen and methane.

A dc discharge was caused across the cathode 1 and the anode to maintain a reaction for 40 hours, and the film quality and film forming rate of diamond were evaluated. The discharge current was maintained at a constant value of 1 A. The film quality was evaluated by the Raman spectroscopic analysis, and maximum values of broad peaks of amorphous carbon and graphite appearing at 1350 cm$^{-1}$ to 1600 cm$^{-1}$ were compared with peak values of diamond appearing at around 1333 cm$^{-1}$ as criteria for evaluation. Table 2 shows the results of diamond films formed under various conditions.

TABLE 2

| No. | Relation Between Emission Intensities of Hα and CH | Methane Concentration with Respect to Hydrogen (%) | Pressure (Torr) | Evaluation of film Quality | Film Forming Rate (μm/h) |
| --- | --- | --- | --- | --- | --- |
| 1 | Hα < CH | 0.2 | 40 | X | 0.1 |
| 2 | Hα < CH | 0.5 | 40 | X | 0.3 |
| 3 | Hα > CH | 1.0 | 40 | △ | 1.3 |
| 4 | Hα > CH | 0.2 | 40 | ○ | 0.3 |
| 5 | Hα > CH | 0.5 | 40 | ○ | 0.8 |
| 6 | Hα > CH | 0.5 | 20 | ○ | 0.7 |
| 7 | Hα > CH | 0.5 | 80 | ○ | 0.9 |

Referring to Table 2, marks ○, △ and x appearing in the column of "film Quality" are defined as follows:

In the Raman spectroscopic analysis, the maximum values of broad peaks of non-diamond carbon components appearing at 1350 cm$^{-1}$ to 1600 cm$^{-1}$ were divided by peak values of diamond appearing at around 1333 cm$^{-1}$, and the results were classified as follows:

○: not more than 0.2
△: 0.2 to 0.6
x: at least 0.6

When the methane concentration was increased to satisfy the condition of Hα>CH (sample No. 3), a superior film quality was attained at a higher film forming rate as compared with a film formed with a low methane concentration under a condition for producing a positive column of Hα<CH by plasma spectral diffraction (sample No. 1 or 2). When methane concentration was temporarily increased until a positive column of Hα>CH was produced and thereafter reduced to synthesize diamond while maintaining the condition of Hα>CH (sample No. 4 or 5), it was possible to synthesize high-quality diamond which hardly contained any non-diamond carbon components such as amorphous carbon and graphite. Comparing the sample No. 1 or 2 with the sample No. 4 or 5, it is clearly seen that the film quality and the film forming rate were greatly improved under similar methane concentration conditions when the emission intensity of Hα was stronger than that of CH in the positive column. In this case, the emission intensities of Hα and CH themselves were abruptly increased to about 100 times in Hα and about several times in CH.

As to the pressure, amorphous carbon was formed and no formation of diamond was recognized under a pressure of not more than 1 Torr. When the pressure exceeded 100 Torr, on the other hand, it was impossible to stably maintain the discharge.

EXAMPLE 3

The apparatus shown in FIG. 1 was employed to synthesize diamond. The cathode 1 was formed by an Mo mesh member having a mesh diameter of 0.2 mm and a pitch of 1 mm. The size of the L-shaped bottom portion of this cathode 1 was 30 mm by 30 mm. The anode 2 was formed by a cylindrical W member of 30 mm in diameter and 10 mm in height. The cathode-to-anode distance was 10 mm. The substrate 3 was formed by a monocrystal Si member of 20 mm by 20 mm. The substrate 3 was placed on the anode 2 and heated by the heater 4, so that its temperature was maintained at 700° C. The reactive gas was a mixed gas of hydrogen to which methane, and oxygen was added.

A dc discharge was made across the cathode 1 and the anode 2 to maintain a reaction for 40 hours, and the film quality and the film forming rate of diamond were evaluated. The discharge current was maintained at a constant value of 1 A. The film quality was evaluated by the Raman spectroscopic analysis, while maximum values of broad peaks of amorphous carbon and graphite appearing at 1350 cm$^{-1}$ to 1600 cm$^{-1}$, were compared with peak values of diamond appearing at around 1333 cm$^{-1}$ as criteria for evaluation. Table 3 shows the results of films formed under various conditions.

TABLE 3

| No. | Relation Between Emission Intensities of Hα and CH | Methane Concentration with Respect to Hydrogen (%) | Oxygen Concentration with Respect to Hydrogen (%) | Pressure (Torr) | Evaluation of film Quality | Film Forming Rate (μm/h) |
| --- | --- | --- | --- | --- | --- | --- |
| 8 | Hα < CH | 0.2 | 0 | 40 | X | 0.1 |
| 9 | Hα < CH | 0.5 | 0 | 40 | X | 0.3 |
| 10 | Hα > CH | 1.0 | 0 | 40 | △ | 1.3 |
| 11 | Hα > CH | 1.0 | 0.3 | 40 | ○ | 0.9 |
| 12 | Hα > CH | 2.0 | 0.7 | 40 | ○ | 1.3 |
| 13 | Hα > CH | 1.0 | 0.3 | 20 | ○ | 0.7 |
| 14 | Hα > CH | 1.0 | 0.3 | 80 | ○ | 1.0 |

Referring to Table 3, marks ○, △ and x appearing in the column of "Film Quality" are defined as follows:

In the Raman spectroscopic analysis, the maximum values of broad peaks of non-diamond carbon components appearing at 1350 cm$^{-1}$ to 1600 cm$^{-1}$ were divided by peak values of diamond appearing at around 1333 cm$^{-1}$, and the results were classified as follows:

○: not more than 0.2
△: 0.2 to 0.6
x: at least 0.6

When the methane concentration was increased to satisfy the condition of Hα>CH (sample No. 10), a superior film quality was attained at a higher film forming rate as compared to a film formed with low methane concentration under a condition for producing a positive column of Hα<CH by plasma spectral diffraction (sample No. 8 or 9). When oxygen was added under the condition of Hα>CH in the sample No. 11 as compared with the sample No. 10, it was possible to synthesize high-quality diamond which hardly contained any non-diamond carbon components such as amorphous carbon and graphite, although the film forming rate was slightly reduced.

As to the pressure, amorphous carbon was formed and no formation of diamond was recognized under a pressure of not more than 1 Torr. When the pressure was in excess of 100 Torr, on the other hand, it was impossible to stably maintain the discharge.

Similar effects were attained also when carbon monoxide and carbon dioxide were employed in place of oxygen as oxygen sources for improving the film quality.

EXAMPLE 4

The apparatus shown in FIG. 1 was employed to synthesize diamond. The cathode 1 was formed by an Mo mesh member having a mesh diameter of 0.2 mm and a pitch of 1 mm. The size of the L-shaped bottom portin of this cathode 1 was 30 mm by 30 mm. The anode 2 was formed by a cylindrical W member of 30 mm in diameter and 10 mm in height. The cathode-to-anode distance was 10 mm. The substrate 3 was formed by a monocrystal Si member of 20 mm by 20 mm. The substrate 3 was placed on the anode 2 and heated by the heater 4, so that its temperature was maintained at 400° C. The reactive gas was mixed gas of hydrogen and methane, and oxygen was added thereto.

A dc discharge was caused across the cathode 1 and the anode 2 to maintain a reaction for 40 hours, and the film quality and the film forming rate of diamond were evaluated. The discharge current was maintained at a constant value of 1 A. The film quality was evaluated by the Raman spectroscopic analysis, while maximum values of broad peaks of amorphous carbon and graphite appearing at 1350 cm$^{-1}$ to 1600 cm$^{-1}$ were compared with peak values of diamond appearing at around 1333 cm$^{-1}$ as criteria for evaluation. Table 4 shows the results of films formed under various conditions.

TABLE 4

| No. | Relation Between Emission Intensities of Hα and CH | Methane Concentration with Respect to Hydrogen (%) | Oxygen Concentration with Respect to Hydrogen (%) | Pressure (Torr) | Evaluation of film Quality | Film Forming Rate (μm/h) |
| --- | --- | --- | --- | --- | --- | --- |
| 15 | Hα < CH | 0.2 | 0 | 25 | X | 0.05 |
| 16 | Hα > CH | 2.0 | 0.7 | 25 | O | 0.1 |

Referring to Table 4, marks O, Δ and x appearing in the column of "Film Quality" are defined as follows:

In the Raman spectroscopic analysis, the maximum values of broad peaks of non-diamond carbon components appearing at 1350 cm$^{-1}$ to 1600 cm$^{-1}$ were divided by peak values of diamond appearing at around 1333 cm$^{-1}$, and the results were classified as follows:

O: not more than 0.2
Δ: 0.2 to 0.6
x: at least 0.6

When the methane concentration was increased to satisfy the condition of Hα>CH (sample No. 16), a superior film quality was attained at a higher film forming rate as compared to a film formed with a low methane concentration under a condition for producing a positive column of Hα<CH by plasma spectral diffraction (sample No. 15). When oxygen was added under the condition of Hα>CH in the sample No. 16, it was possible to synthesize, at 400° C., high-quality diamond which hardly contained any non-diamond carbon components such as amorphous carbon and graphite.

As to the pressure, amorphous carbon was formed and no formation of diamond was recognized under a pressure of not more than 1 Torr. When the pressure was in excess of 100 Torr, on the other hand, it was impossible to stably maintain the discharge.

Similar effects were attained also when carbon monoxide and carbon dioxide were employed in place of oxygen as oxygen sources for improving the film quality.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A diamond synthesizing method comprising the steps of introducing a mixed gas of hydrocarbon gas and hydrogen gas into a reaction vessel and causing a dc discharge across a cathode an anode under a pressure of 1 to 100 Torr thereby depositing diamond on a substrate being placed on said anode, wherein concentration of said hydrocarbon gas with respect to said hydrogen gas is increased until emission intensities of Hα (656.3 nm) and CH (431.4 nm) satisfies an emission condition of Hα>CH in the emission spectrum of a positive column produced during discharge, and adding gas containing oxygen to said mixed gas for stably maintaining said positive column under said emission condition of Hα>CH and for effectively removing non-diamond carbon.

2. A diamond synthesizing method comprising the steps of introducing a mixed gas of hydrocarbon gas and hydrogen gas into a reaction vessel and causing dc discharge across a cathode and an anode under a pressure of 1 to 100 Torr thereby depositing diamond on a substrate being placed on said anode, wherein
concentration of said hydrocarbon gas with respect to said hydrogen gas is increased until emission intensities of Hα (656.3 nm) and CH (431.4 nm) satisfies a condition of Hα>CH in the emission spectrum of a region of a positive column produced during discharge, and said concentration of said hydrocarbon gas is reduced after a positive column satisfying said condition is produced.

* * * * *